United States Patent
Iwamoto et al.

(10) Patent No.: US 7,872,282 B2
(45) Date of Patent: Jan. 18, 2011

(54) SEMICONDUCTOR DEVICE AND METHOD OF MANUFACTURING SAME

(75) Inventors: Susumu Iwamoto, Matsumoto (JP); Takashi Kobayashi, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 0 days.

(21) Appl. No.: 12/365,159

(22) Filed: Feb. 3, 2009

(65) Prior Publication Data

US 2009/0194786 A1 Aug. 6, 2009

(30) Foreign Application Priority Data

Feb. 4, 2008 (JP) .............................. 2008-023435

(51) Int. Cl.
*H01L 29/74* (2006.01)
*H01L 31/111* (2006.01)
*H01L 29/76* (2006.01)
*H01L 29/94* (2006.01)
*H01L 27/108* (2006.01)

(52) U.S. Cl. ..................... 257/139; 257/330; 257/369; 257/296

(58) Field of Classification Search ................. 257/203, 257/139, 141, 544, 550, 330, 394, 369, 546, 257/378, 370, 332, 372, 296, 355, 606, 371, 257/373
See application file for complete search history.

(56) References Cited

U.S. PATENT DOCUMENTS

| 5,148,255 | A | * | 9/1992 | Nakazato et al. ............. 257/378 |
| 5,828,101 | A | * | 10/1998 | Endo ........................... 257/330 |
| 2004/0256691 | A1 | | 12/2004 | Nemoto et al. |
| 2008/0303057 | A1 | * | 12/2008 | Iwamuro ...................... 257/141 |

FOREIGN PATENT DOCUMENTS

| JP | 2001-185727 A | 7/2001 |
| JP | 2002-319676 A | 10/2002 |
| JP | 2005-101254 A | 4/2005 |
| JP | 2005-252212 A | 9/2005 |

* cited by examiner

*Primary Examiner*—Chuong A. Luu
(74) *Attorney, Agent, or Firm*—Rossi, Kimms & McDowell LLP

(57) ABSTRACT

A semiconductor device includes deep first field limiting rings, shallow second field limiting rings, insulation films covering each surface portion of each of the first and the second field limiting rings, and conductive field plates each in contact with a surface of each of the first and the second field limiting rings. Each of the field plates project over a surface of each of the insulation films between the first field limiting rings and the second field limiting rings.

15 Claims, 15 Drawing Sheets

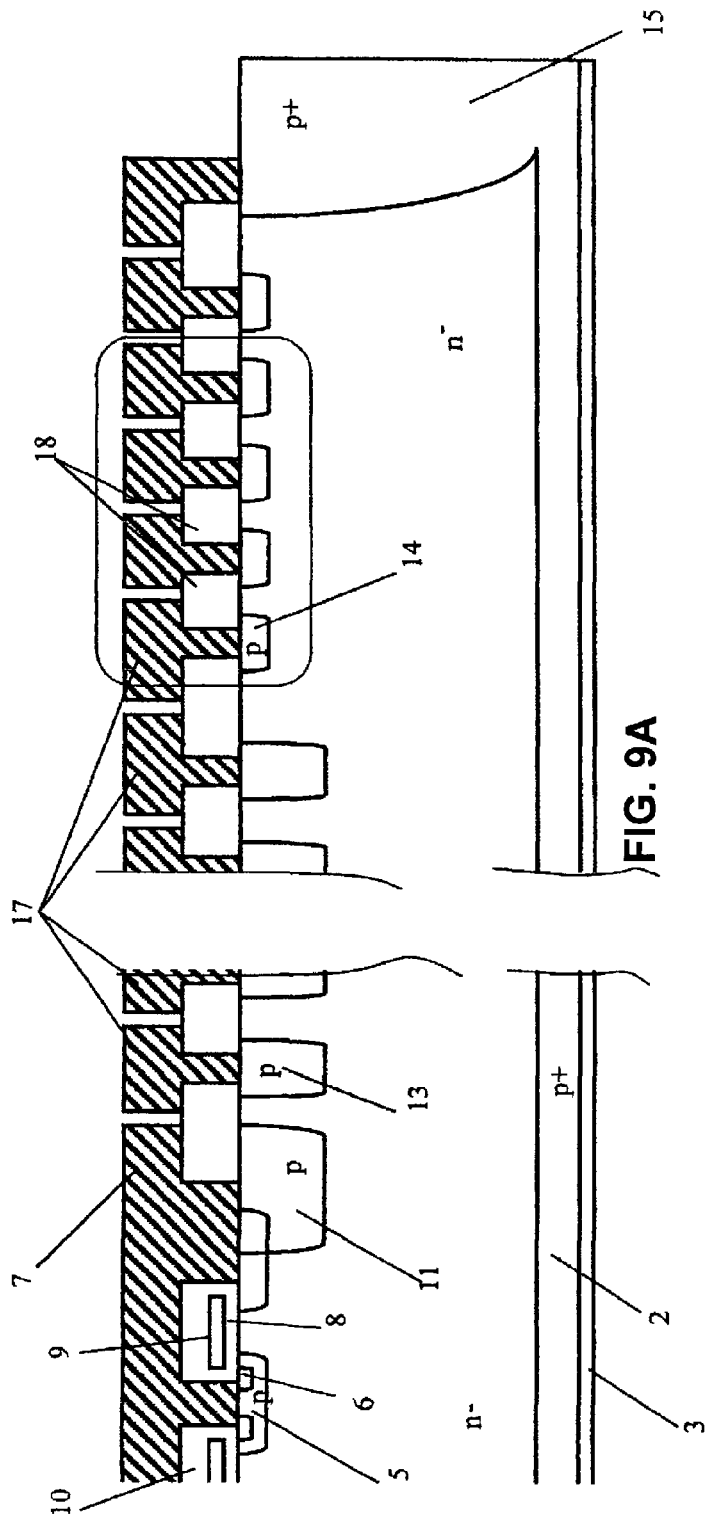
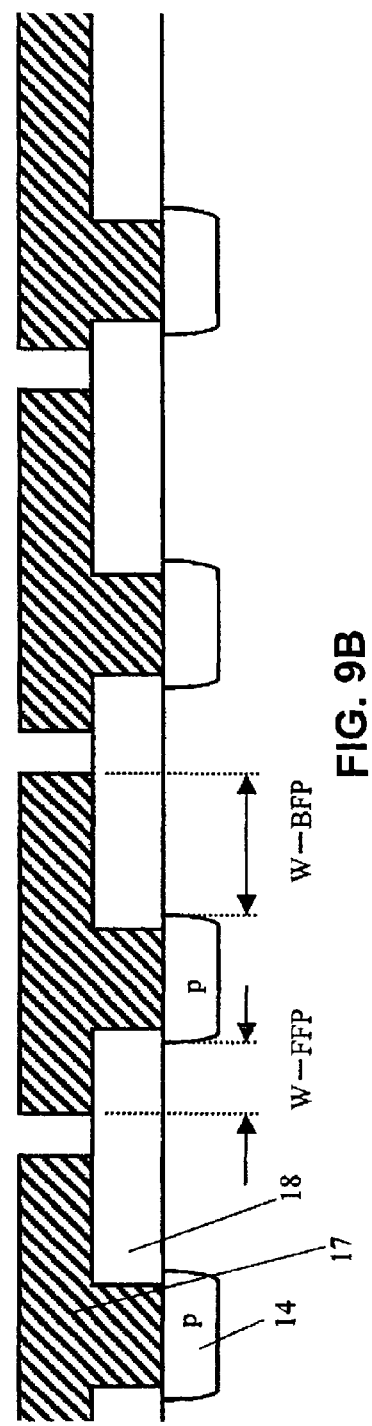

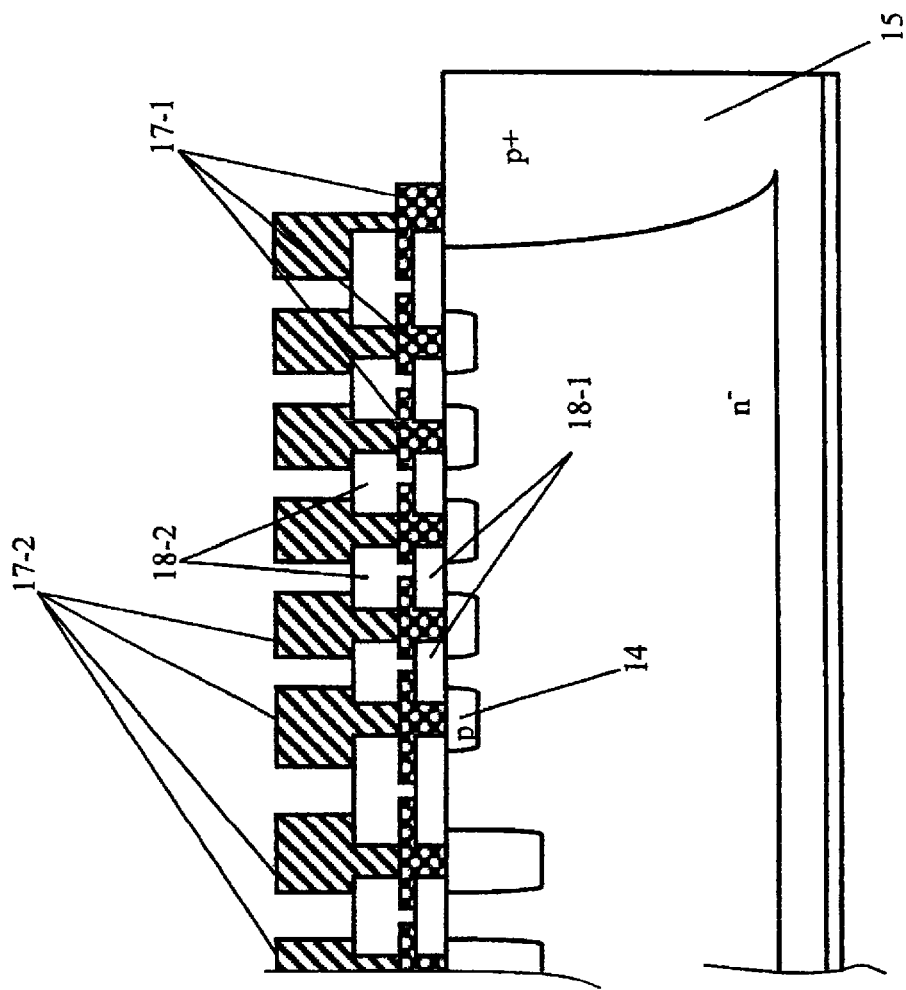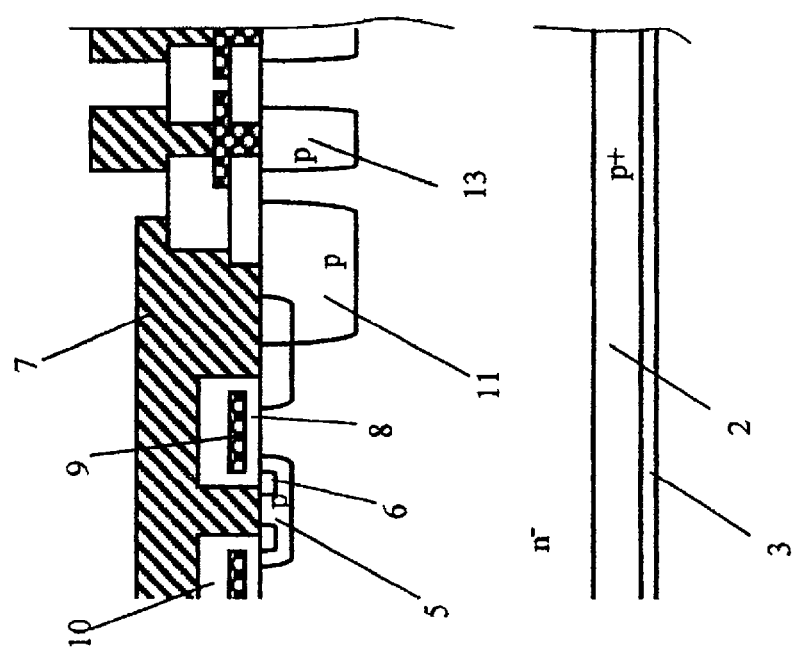
FIG. 11

SEMICONDUCTOR DEVICE AND METHOD OF MANUFACTURING SAME

BACKGROUND OF THE INVENTION

The present invention relates to power semiconductor devices for use in power converters, in particular, to bidirectional devices or reverse blocking devices having bidirectional blocking capability.

FIG. 12 is a partial sectional view showing a peripheral region of a conventional ordinary planar junction IGBT. In operation of the IGBT, reliability on voltage blocking capability is guaranteed only in one direction (forward blocking capability). Since a reverse blocking function is born by reverse blocking ability of a diode, reliability on reverse blocking capability of the IGBT itself is beyond the guarantee. When a forward bias voltage is applied between the emitter electrode 108 and the collector electrode 109 of the IGBT with the emitter electrode at a ground potential and the collector electrode at a positive potential, the front 115 of the depletion layer extending from the pn junction 114 between the p-type base region 102 and the n-type drift layer 103 expands on the substrate surface while being stretched by a guard ring 113 surrounding the pn junction. As a result, an electric field on the substrate surface is relaxed. In addition, since a surface of the voltage blocking structure region 111 is protected by a protective film 116 of an insulation film, forward blocking capability is enhanced. On the other hand, if a reverse bias voltage of negative potential is applied on the collector electrode 109, a depletion layer (not shown in FIG. 12) begins to extend in the n-type drift layer from the pn junction 100 of the p-type collector layer 104 in the back surface side towards the emitter region 105. Since the peripheral end 101 of the pn junction 100 is exposed to the as-cut surface 112 created by a dicing process, a leakage current grows at the peripheral end 101, inhibiting reverse blocking with high reliability. In supplementary description on the reference numerals that are not mentioned in the above description on the IGBT, the reference numeral 110 represents an active region in which a main current flows, the numeral 106 represents a gate oxide film, and the numeral 107 represents a gate electrode.

Recently, a demand in the market for IGBTs having reverse blocking capability with high reliability is growing for applications to matrix converters and other systems. In order to meet the demand and improve reverse blocking capability and reliability of the conventional ordinary IGBT, a mesa type reverse blocking IGBT has been proposed as shown in FIG. 13 (Japanese Unexamined Patent Application Publication No. 2001-185727). This mesa type reverse blocking IGBT comprises a deep groove 122 formed by etching from the substrate surface beyond the collector pn junction 100, and a protective film 123 protects the peripheral end 101 of the pn junction exposed to the slanted inner surface of the groove. This structure prevents a front 117 of the depletion layer from extending to the dicing cut surface 112 located outside the groove and imparts reverse blocking capability with high reliability. This method, while serves a desired reverse blocking ability, needs a drift layer 103 of thick epitaxial layer (for example, a drift layer thickness of 100 μm and a thickness of the whole substrate of at least 250 μm for a breakdown voltage of 600 V), deteriorating a trade-off relationship between the saturation voltage Vce(sat) and the switching loss Eoff at the time of turn-off.

To cope with this problem, a reverse blocking IGBT of an isolated diffusion layer type as shown in FIG. 14 has been proposed (Japanese Unexamined Patent Application Publication No. 2002-319676) in which an isolated diffusion layer 121 is formed by impurity diffusion from the substrate surface to expose the peripheral end of the collector pn junction to the substrate surface and protect the end by an insulation film 116 commonly with the forward blocking structure region 111. This method allows fabricating a thin reverse blocking IGBT having an overall thickness of a semiconductor substrate of about 100 μm, substantially improving the trade-off relationship between the Vce(sat) and the switching loss Eoff at the time of turn-off. The reference numerals in FIG. 13 and FIG. 14 same as in FIG. 12 represent the same or corresponding functional regions as in FIG. 12.

In addition, a reverse blocking IGBT having ensuring both high forward blocking ability and high reverse blocking ability is known (Japanese Unexamined Patent Application Publication No. 2005-101254) in which the peripheral end of the reverse blocking junction is bent by an isolation diffusion layer to expose to the blocking structure region on the surface similar to the method of Japanese Unexamined Patent Application Publication No. 2002-319676 and further, a p-type field limiting ring (guard ring) structure and a conductive field plate structure are provided in the blocking structure region, the field plate protruding on an insulation film towards the center of the blocking structure region.

Another blocking structure for a bidirectional semiconductor device has been disclosed (Japanese Unexamined Patent Application Publication No. 2005-252212) in which a forward blocking structure region and a reverse blocking structure region are made to have an approximately equal width, wherein the forward blocking structure region alleviates electric field concentration on the substrate surface at the time of depletion layer extension from a main pn junction in a mostly emitter side, and the reverse blocking structure region alleviates electric field concentration at the time of depletion layer extension from a pn junction of the isolated diffusion layer like in Japanese Unexamined Patent Application Publication No. 2005-101254.

Concerning the reverse blocking devices, adequate studies have not been made enough on the optimum voltage blocking structure region. A length (a width on the surface) of the voltage blocking structure region conventionally tends to be made longer than a necessary length. A voltage blocking structure region disclosed in Japanese Unexamined Patent Application Publication No. 2005-252212 has approximately equal widths on the surface of the voltage blocking structure regions for a reverse blocking mode in which a depletion layer extends from a pn junction at the back surface collector layer and the isolation diffusion layer, and for a forward blocking mode in which a depletion layer extends from a main pn junction in the emitter side. In the reverse blocking mode, however, the depletion layer extends from the deep isolation diffusion layer and the whole of the back surface collector layer side. Thus, the length of the voltage blocking structure region does not need to be approximately equal to the length for the forward blocking mode in which the depletion layer extends solely from the emitter layer side. Consequently, there is a possibility to shorten the voltage blocking structure region for retaining the reverse blocking in which the depletion layer extends from the deep isolation diffusion layer and whole of the back surface collector region as compared with the width of the voltage blocking structure region for the forward blocking. As a result, if a width of the voltage blocking structure region for retaining the reverse blocking is made equal to the width of the voltage blocking structure region for the forward blocking (that is, the length of the voltage blocking structure region for the reverse blocking is made to be a length of a folded-back voltage blocking structure region for the forward blocking), the width of the voltage blocking structure region for the reverse blocking is longer than as needed. Therefore, such a configuration leads to an enlarged chip size and raised cost. On the contrary, if the voltage blocking structure regions are shortened for the purpose of reduction in the chip costs leaving the widths of the voltage blocking structure regions for the reverse blocking unchanged, it is very difficult to ensure satisfactory reliability of the device (for example, resistance to charges of the voltage blocking structure region). It is therefore very difficult to achieve compatibility between an appropriate chip cost and satisfactory reliability.

SUMMARY OF THE INVENTION

In view of the above issues, the conventional voltage blocking structure region having the same widths of the forward and reverse blocking structure regions has been reconsidered. The present invention provides a semiconductor device and method with a low cost chip by adjusting the forward and reverse blocking structure regions at optimum widths in respect of voltage blocking performance and reliability to reduce a total width of the voltage blocking structure region.

In order to achieve the above results, a semiconductor device of the invention preferably includes a semiconductor substrate of an n-type (it should be noted that the following description will be made for a case of a first conductivity type of an n-type and a second conductivity of a p-type, but the present invention works for a case of a first conductivity type of a p type and a second conductivity of an n type), an active region that includes a well of a p-type formed in a surface region of a first principal surface side of the semiconductor substrate, a base region of the p-type formed in the surface region at a different position from that of the well, an emitter region of the n-type formed in a surface region of the base region, a gate insulation film covering a portion of a surface of the base region locating between the emitter region and the semiconductor substrate and the portion of the surface of the semiconductor substrate, a gate electrode formed on the gate insulation film, an isolation diffusion region of the p-type formed surrounding the active region and extending from the first principal surface to a second principal surface of the semiconductor substrate, a collector region of the p-type formed in a surface region of the second principal surface, a voltage blocking structure region formed on a surface region of the device between the isolation diffusion region of the p-type and the active region, and an emitter electrode in contact commonly with both a surface of the emitter region and a portion of the surface of the base region. The voltage blocking structure region preferably includes a plurality of deep first field limiting rings in an inner circumferential side of the surface region of the first principal surface side, a plurality of shallow second field limiting rings in an outer circumferential side of the surface region of the first principal surface side, a plurality of insulation films each covering a portion of the first principal surface between the first field limiting rings and a portion of the first principal surface between the second field limiting rings, and a plurality of conductive field plates in contact with the field limiting ring, the field limiting ring projecting over surfaces of the adjacent insulation films.

A semiconductor device of the invention further preferably includes a counter doped region of the n-type with a depth not shallower than a depth of the base region of the p-type and not deeper than a depth of the well of the p-type formed in a portion of the surface region of the semiconductor substrate between the adjacent base regions of the p-type and extending to portions of the adjacent base regions locating between the emitter region and the portion of the surface region of the semiconductor substrate, the counter doped region having such an impurity concentration that does not invert the conductivity type of the base region of the p-type.

Preferably, a depth of the first field limiting rings is substantially equal to a depth of the p-type well and a depth of the second field limiting rings is substantially equal to a depth of the p-type base region.

Further, the conductive field plate preferably has a length of a portion thereof protruding over the surface of the insulation film in the emitter side shorter than a length of a portion thereof protruding over the surface of the insulation film in the isolation diffusion region side.

The semiconductor device according to the invention, advantageously, further includes an n-type depletion controlling layer formed in a surface region between the first field limiting rings and the second field limiting rings.

The semiconductor device according to the invention, advantageously, further includes n-type depletion control layers selectively formed in the surface region of the device in the isolation diffusion layer side of each of the second field limiting rings.

Preferably, a width of a voltage blocking structure region for forward direction blocking is longer than a width of the voltage blocking structure region for reverse direction blocking.

Advantageously, the conductive field plates in contact with the field limiting rings are composed of the same material as a material of the gate electrode.

Advantageously, the conductive field plates in contact with the field limiting rings are composed of the same material as a material of the emitter electrode in contact commonly with both the surface of the emitter region and the surface of the base region.

Preferably, the conductive field plate in contact with the surface of the field limiting ring is composed of a lamination comprising a portion made of a material same as that of the gate electrode and a portion made of a material same as that of the emitter electrode.

In a preferred method of the invention for manufacturing the semiconductor device, the first field limiting rings are formed simultaneously with the p-type well, and the second field limiting rings are formed simultaneously with the p-type base region.

It is preferable in the method of the invention for manufacturing a semiconductor device to form the conductive field plates simultaneously with the gate electrode.

It is also favorable in the method of the invention for manufacturing a semiconductor device to form the conductive field plates simultaneously with the emitter electrode.

It is yet preferable in the method of the invention for manufacturing a semiconductor device to form the n-type depletion controlling region simultaneously with the n-type counter doped region.

The present invention provides a semiconductor device and method with a low cost chip by adjusting the forward and reverse blocking structure regions at optimum widths in respect of voltage blocking performance and reliability to reduce a total width of the voltage blocking structure region.

BRIEF DESCRIPTION OF THE DRAWINGS

The invention will now be described with reference to certain preferred embodiments thereof and the accompanying drawings, wherein:

FIG. 1-2 is a sectional view taken along the line A1-A2 in FIG. 1-1 according to the invention;

FIG. 2 is a partial sectional view of a voltage blocking structure region of a semiconductor substrate of a conventional ordinary IGBT for comparison with the invention;

FIGS. 9(a) and 9(b) are partial sectional views of a voltage blocking structure region of a semiconductor substrate of a reverse blocking IGBT of Example 3 according to the invention;

FIG. 11 is a partial sectional view of a voltage blocking structure region of a semiconductor substrate of a reverse blocking IGBT of Example 9 according to the invention;

DETAILED DESCRIPTION OF THE PREFERRED EMBODIMENTS OF THE INVENTION

A semiconductor device and a method of manufacturing the device will be described in detail in the following with reference to accompanying drawings. It shall be understood that the present invention is not limited by the following description on the preferred embodiments as far as it does not exceed the scope and spirit of the invention.

Example 1

Figure 1:
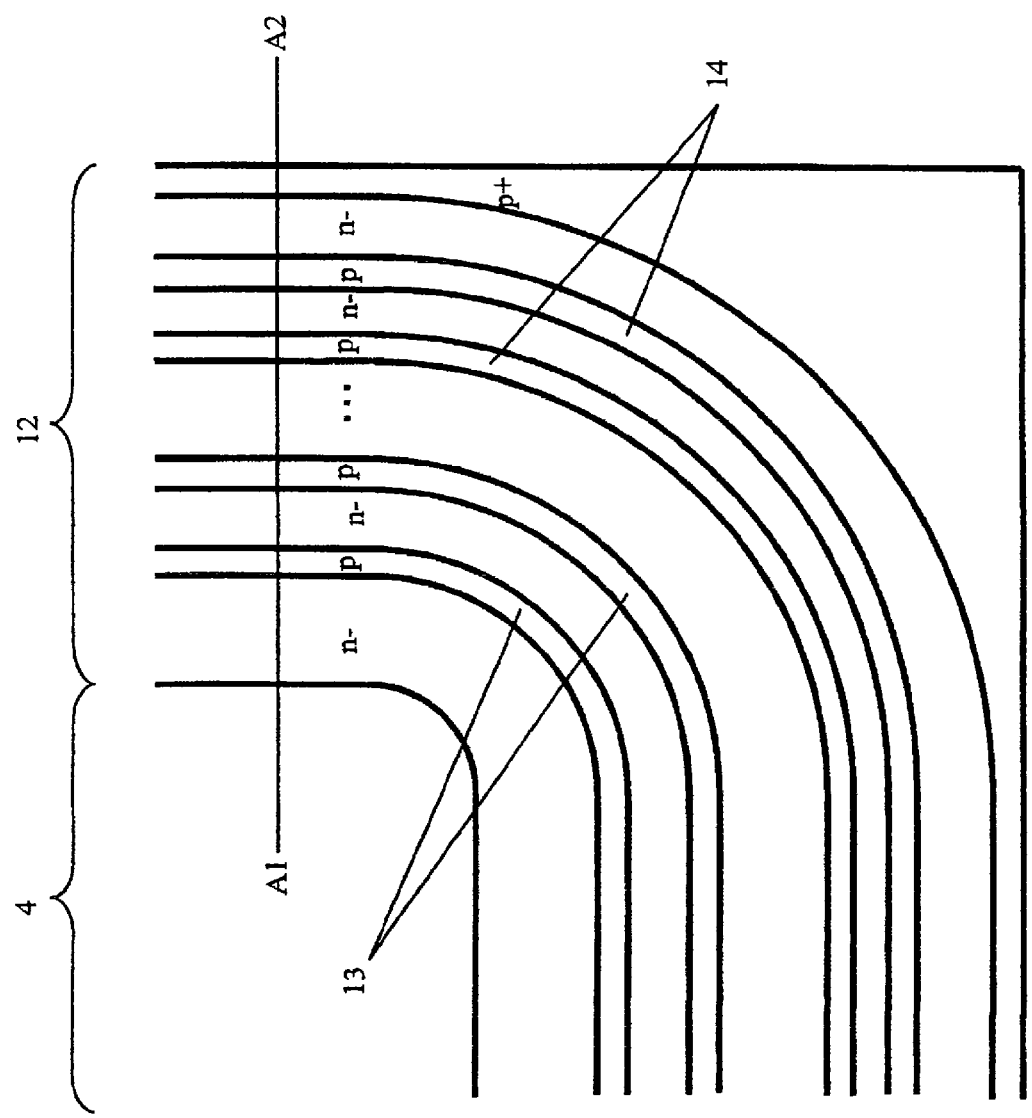
FIG. 1-1 is a partial plan view of a voltage blocking structure region of a semiconductor substrate of a reverse blocking IGBT of Example 1 according to the invention.
Figures 1, 2:
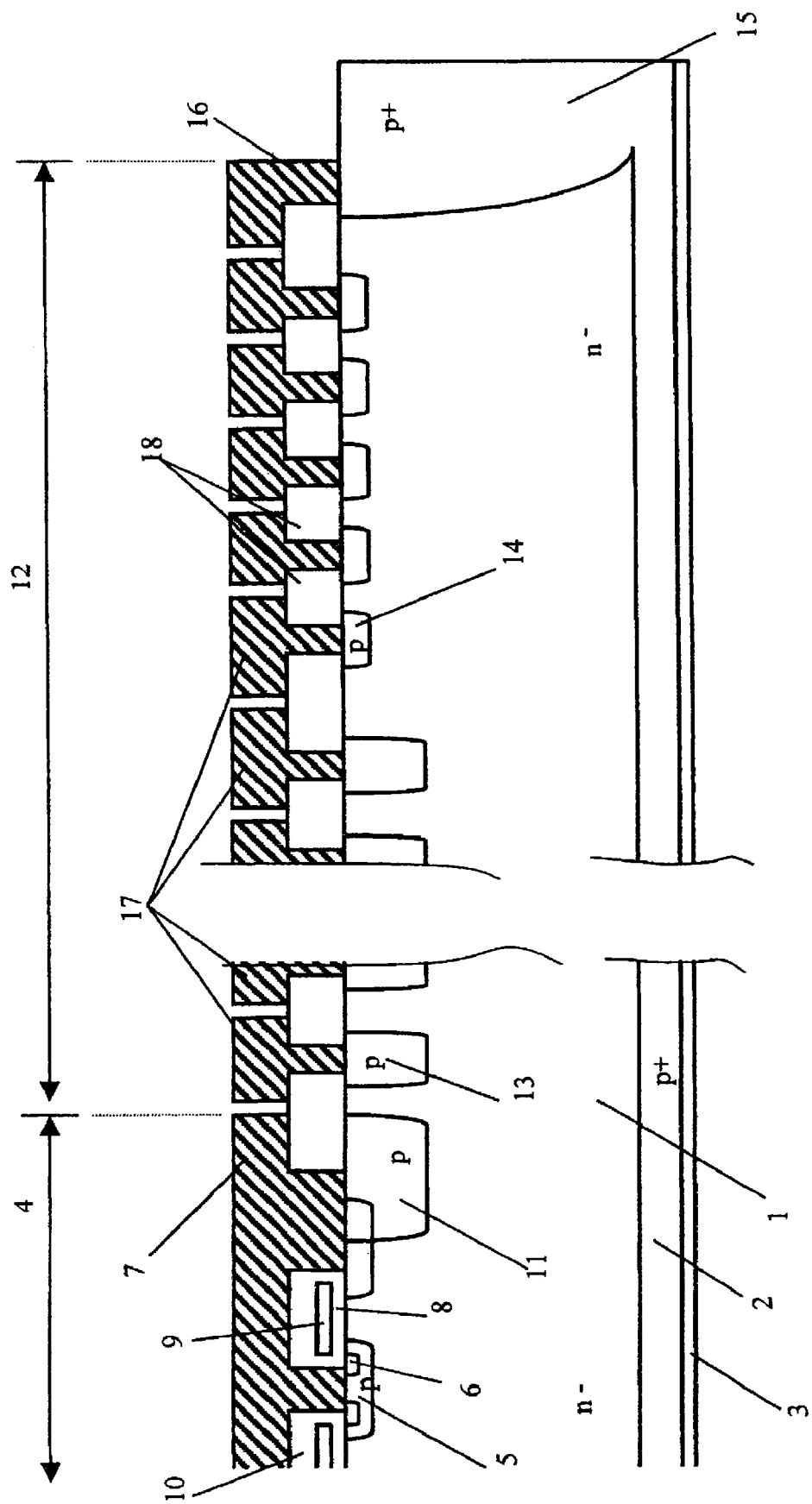
Figure 2:
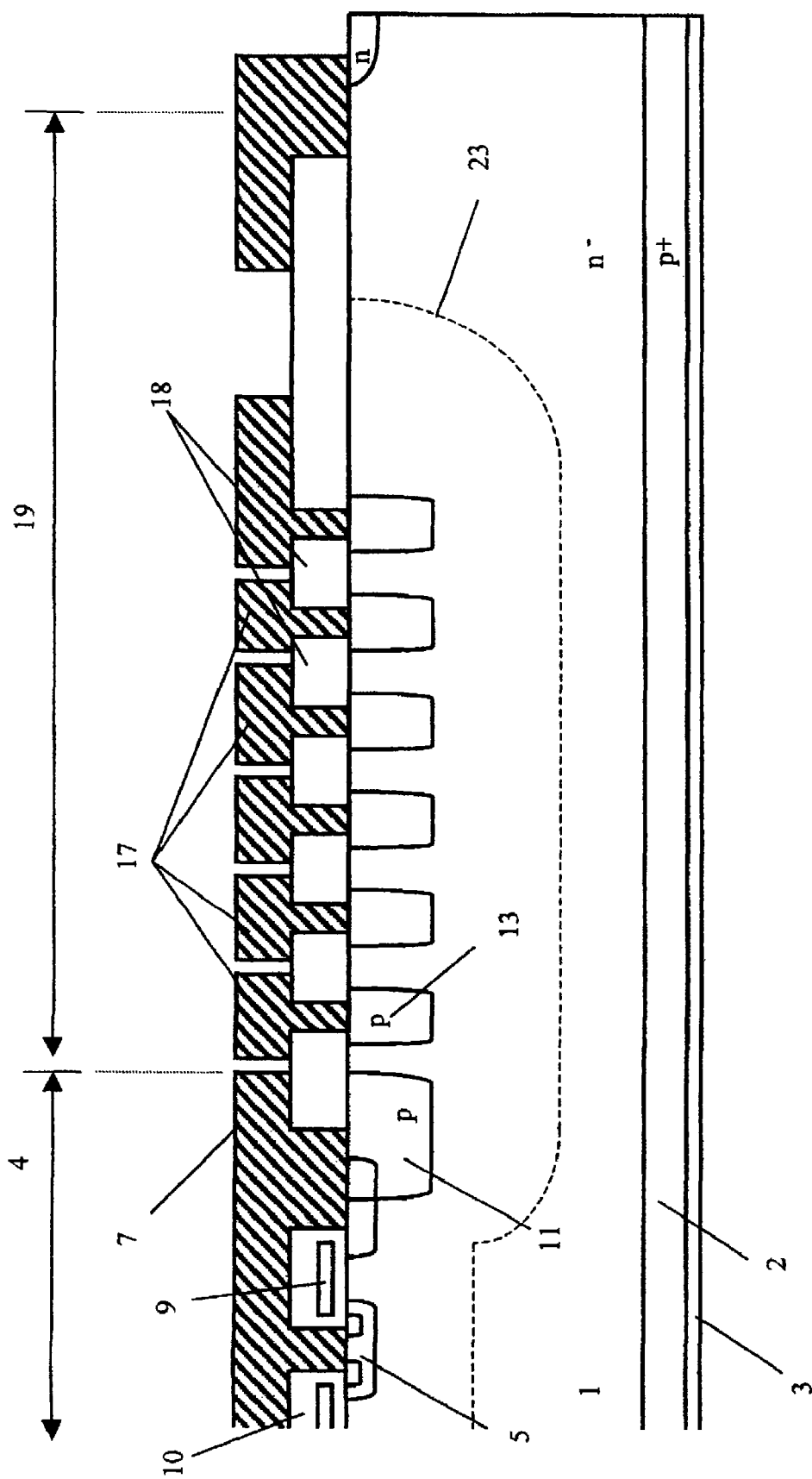

Example 1 is an embodiment corresponding to claims 1 through 3 and claims 11 through 13. FIG. 1-1 is a partial plan view of a reverse blocking IGBT of Example 1, and FIG. 1-2 is a sectional view cut along the line A1-A2 in FIG. 1-1. The partial plan view of FIG. 1-1 is depicted removing insulation films, electrode films, and most of the surface configurations of regions in the active region on and under the substrate surface in order to clearly indicate the configuration of the field limiting rings (hereinafter, also abbreviated to FLRs) on the surface of the voltage blocking structure region. FIG. 1-1 and FIG. 1-2 do not exactly correspond with each other in respect of configurations and dimensions. The following description on the embodiment is made in the case the first conductivity type is n-type and the second conductivity type is p-type. As shown in FIG. 1-2, the reverse blocking IGBT has a drift layer 1 of an n-type semiconductor substrate, and a p-type collector layer 2 and a collector electrode 3 in the back surface side of the semiconductor substrate. An active region 4 on the front surface side of the substrate in which main current flows is provided with a p-type base region 5 formed in a surface region of the substrate and an n-type emitter region 6 formed in a surface region of the n-type base region 5. A gate electrode 9 is provided via a gate insulation film 8 on the surface of the p-type base region 5 between the surface of the n-type emitter region 6 and a surface of the n-type drift layer 1. The gate electrode 9 is formed of conductive polycrystalline silicon while other known conductive materials can be used, too. An emitter electrode is provided covering the gate electrode 9 via an interlayer insulation film 10. The emitter electrode 7 is preferably composed of an Al—Si alloy film while other metallic materials that allow soldering on the uppermost surface can be used as required. The emitter electrode 7 is in contact commonly with the surfaces of the p-type base region 5 and the n-type emitter region 6. A p-type well 11 is provided in the outermost peripheral region of the active region 4 and surrounding the p-type base region 5, the p-type well 11 having a depth deeper than that of the p-type base region 5 and in contact with the emitter electrode 7 at the surface of the p-type well 11. In addition, as shown in the partial sectional view of FIG. 7 though not shown in FIG. 1-2, an n-type counter doped region 40 is preferably formed between the adjacent p-type base regions 5 in the active region 4 in order to reduce a gate threshold voltage by decreasing actual impurity concentration in the region of the p-type base region 5 functioning as a channel and to reduce on-voltage by increasing an impurity concentration in the surface region of the n-type drift region 1 between the adjacent p-type base regions 5. Further, at least one p-type first field limiting ring (first FLR) 13 and at least one p-type second field limiting ring (second FLR) 14 formed outside the first FLR 13 are arranged in a voltage blocking structure region 12 disposed outside the periphery of the active region 4. The first FLR 13 is formed with a depth equal to that of the p-type well 11 and the second FLR 14 is formed with a depth equal to that of the p-type base region 5. The FLRs can also be called as guard rings. Outside the periphery of the voltage blocking structure region 12, a p-type isolation diffusion layer 15 continuing to the p-type collector layer 2 in the back surface side and a upper side collector electrode 16 in contact with the front surface of the p-type isolation diffusion layer 15 are disposed. Conductive field plates 17 are formed on and adhering to the surfaces of the first FLRs and the second FLRs in the voltage blocking structure region 12. The conductive field plates 17 are not electrically connected to the emitter electrode 7 and the collector electrodes 3, 16, and at an independent electric potential by being insulated from the surface of the drift layer 1 with insulation films 18. The conductive field plates 17 are advantageously formed simultaneously with the gate electrode in view of working efficiency, while formation at the same time with the emitter electrode is possible, too.

When a reverse voltage is applied on a reverse blocking IGBT of Example 1 with a collector electrode 3 at a negative electric potential relative to the emitter electrode 7, a depletion layer extends in the n-type drift layer 1 from the pn junctions of the p-type collector layer 2 and of the p-type isolation diffusion layer 15. In a substrate surface region over the region of the extending depletion layer, the voltage blocking structure region 12 of Example 1 is provided with not the first FLRs 13, but the second FLRs 14 that are formed with a depth equal to the depth of the p-type base region 5 and shallower than the first FLRs 14. This configuration is an outstanding feature of the voltage blocking structure region 12 of the reverse blocking IGBT of Example 1.

FIG. 2 shows an outline shape of a depletion layer 23 by a dotted line when a forward bias voltage is applied to an ordinary, not reverse blocking IGBT with a positive potential on the collector electrode 3 relative to the emitter electrode 7. In the use of an ordinary IGBT as shown in FIG. 2, the depletion layer 23 extending to the voltage blocking structure region 19 develops from the pn junction of the p-type base region 5 into the n-type drift layer along the pn junction. As a result, the depletion layer, which develops along a pn junction including a portion with certain curvature, also has a portion with a curvature corresponding to a magnitude of the curvature of the pn junction. A smaller radius of curvature in the curved portion makes an interval between equipotential lines in the depletion layer narrower, intensifying electric field concentration. Consequently, when first FLRs 13 are formed in the surface region of the voltage blocking structure region 19 to relax the electric field on the substrate surface as shown in the partial sectional view of FIG. 2, the first FLRs 13 have preferably the depth of the p-well 11 deeper than the p-type base region 5 because of its larger radius of curvature imparting more effective relaxation of the electric field and greater blocking voltage.

Figure 3:
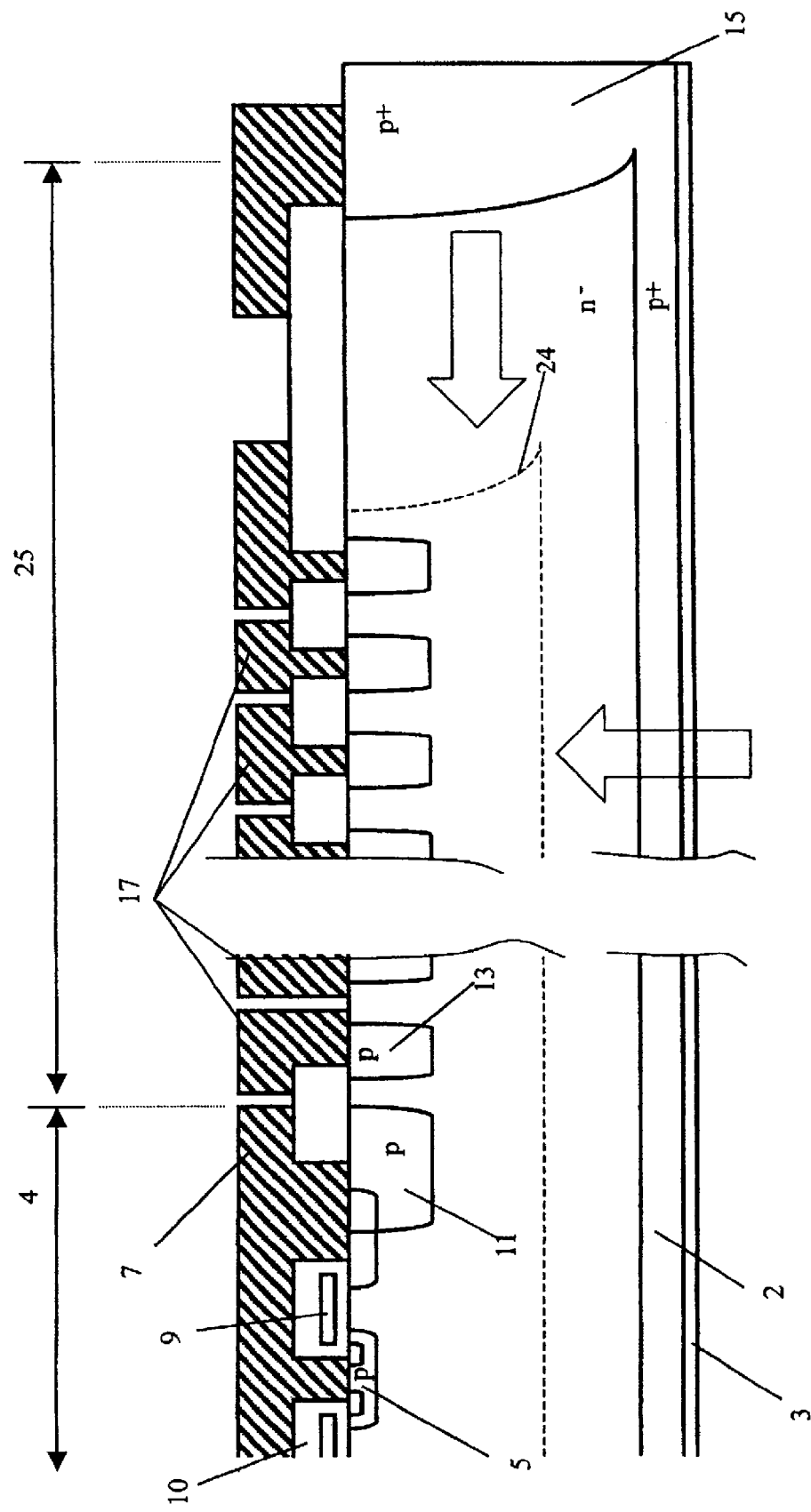
FIG. 3 is a partial sectional view of a voltage blocking structure region of a semiconductor substrate of a conventional ordinary IGBT for comparison with the invention.

On the other hand, a reverse bias voltage is applied on the collector electrode 3 of a reverse blocking IGBT with a negative potential at the collector electrode 3 relative to the emitter electrode 7, as shown in the partial sectional view of FIG. 3, the depletion layer 24 develops from the pn junctions of the isolation diffusion layer 15 and of the p-type collector layer 2 because the p-type isolation layer 15 and the p-type collector layer 2 continuing in the same p-type region. As a result, the voltage blocking structure region 25 needs to be designed to ensure sufficiently high reverse blocking voltage on the surface.

Figure 4:
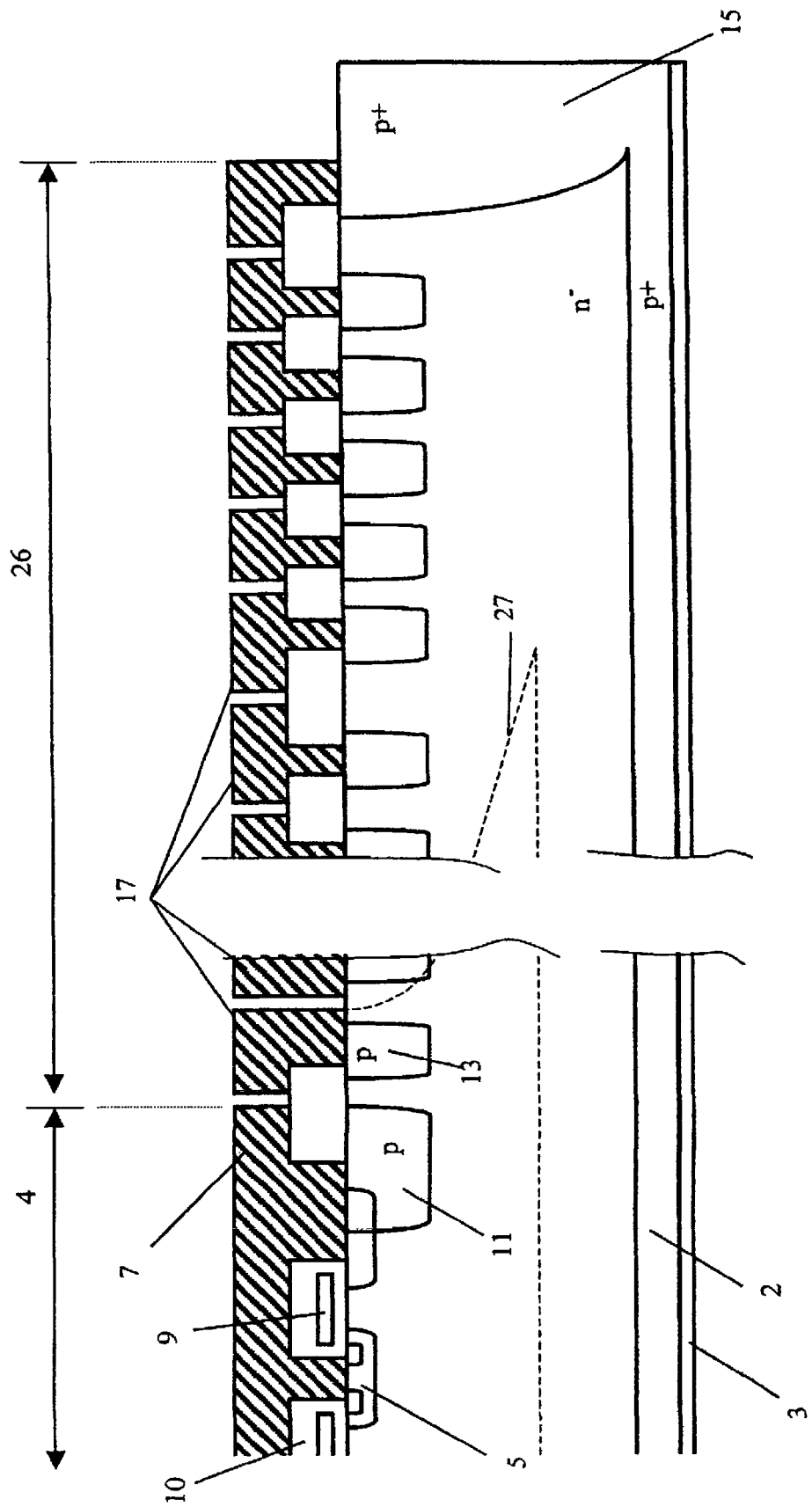
FIG. 4 is a partial sectional view of a voltage blocking structure region of a semiconductor substrate of a conventional ordinary IGBT for comparison with the invention.

FIG. 4 shows schematically the expansion of a depletion layer 27 (indicated by the dotted line) in the case of a voltage blocking structure region 26 having an electric field relaxation structure including solely first FLRs 13 that are formed simultaneously with a deep p-well 11. In this voltage blocking structure region 26, a depletion layer 27 extends from the pn junctions of the isolation diffusion layer 15 and the p-type collector layer 2. Nevertheless, since the deep first FLRs 13 excessively relax the electric field and the electric potential shared by one FLR is low, a width on the surface of the voltage blocking structure region 26 needs to be long in order to ensure the reverse blocking capability. Further, there is a fear of degradation in voltage blocking capability when inaccuracy in the fabrication process is taken into consideration. For example, if an impurity concentration in the p-type well 11 happens to be increased, the depletion layer 27 extends too far reaching the emitter electrode 7, which induces degradation of voltage blocking capability. In that condition, the voltage cannot be retained, and moreover, a large leakage current develops abruptly.

To improve this situation, the shallow second FLRs 14 are formed simultaneously with the p-type base region 5 formed in the active region 4 in Example 1 as shown in the partial sectional view of FIG. 1-2. This configuration controls the excessive expansion of the depletion layer extending from the side of the isolation diffusion layer 15 and increases an electric potential shared by one FLR. Therefore, the length of the reverse blocking structure region is shortened owing to the control of extension of the depletion layer in the reversed direction.

Figure 5:
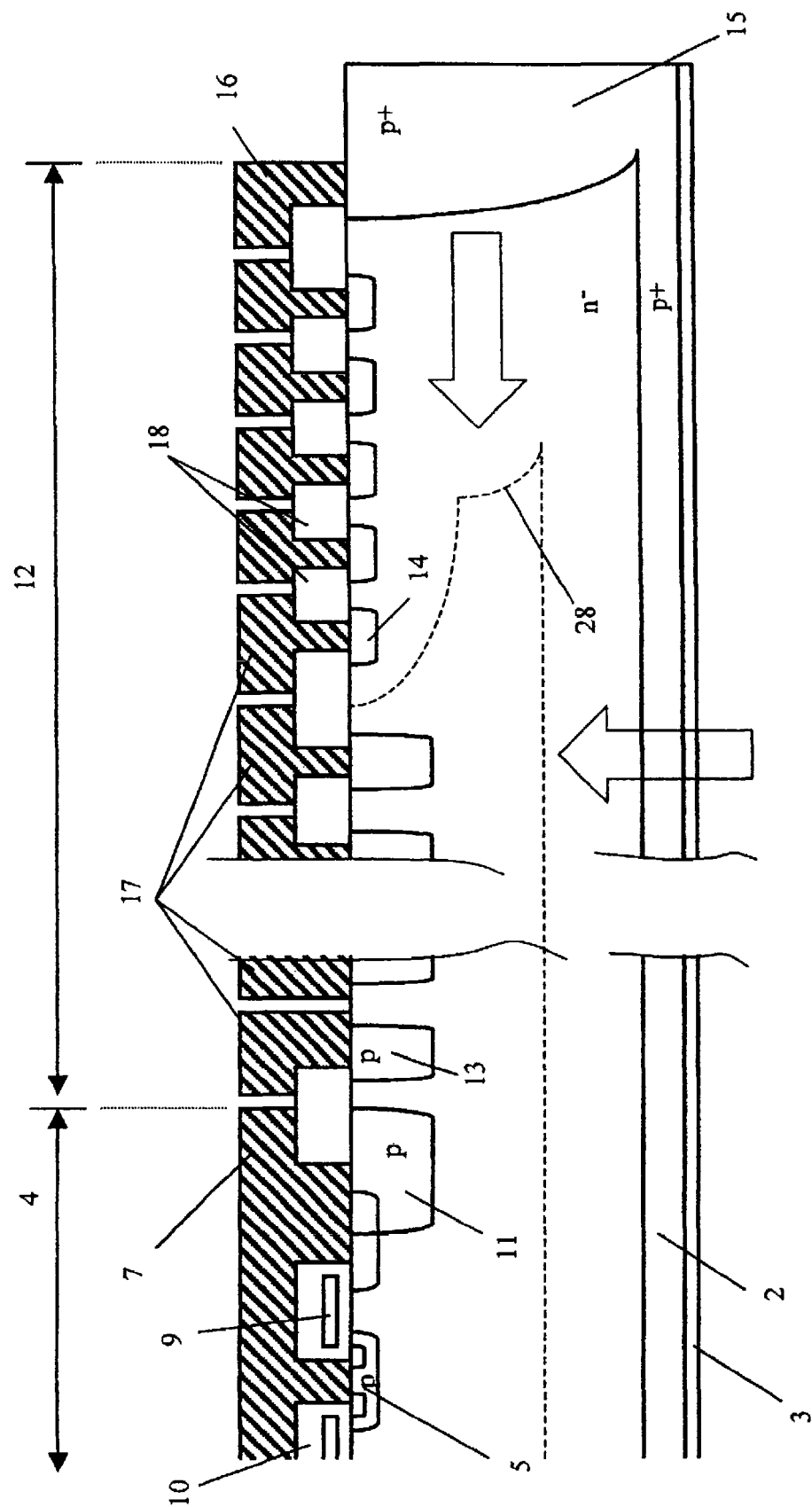
FIG. 5 is a partial sectional view of a voltage blocking structure region of a semiconductor substrate of a reverse blocking IGBT of Example 1 according to the invention.

The partial sectional view of FIG. 5 shows an outline configuration of extension of the depletion layer 28 (indicated by a dotted line) in the structure, as Example 1 illustrated in the partial sectional view of FIG. 1-2, comprising first FLRs 13 of a deep p-type layer with a depth equal to the depth of the p-type well 11 and second FLRs 14 of a shallow p-type layer with a depth equal to the depth of the p-type base region 5 formed in the active region 4. Comparing with the structure of FIG. 4 in which all the FLRs are formed of deep p-type layers with a depth equal to the depth of the p-type well 11, the structure according to the invention shown in FIG. 5 controls excessive extension of the depletion layer 28 by the shallower second FLRs.

Figure 6A:
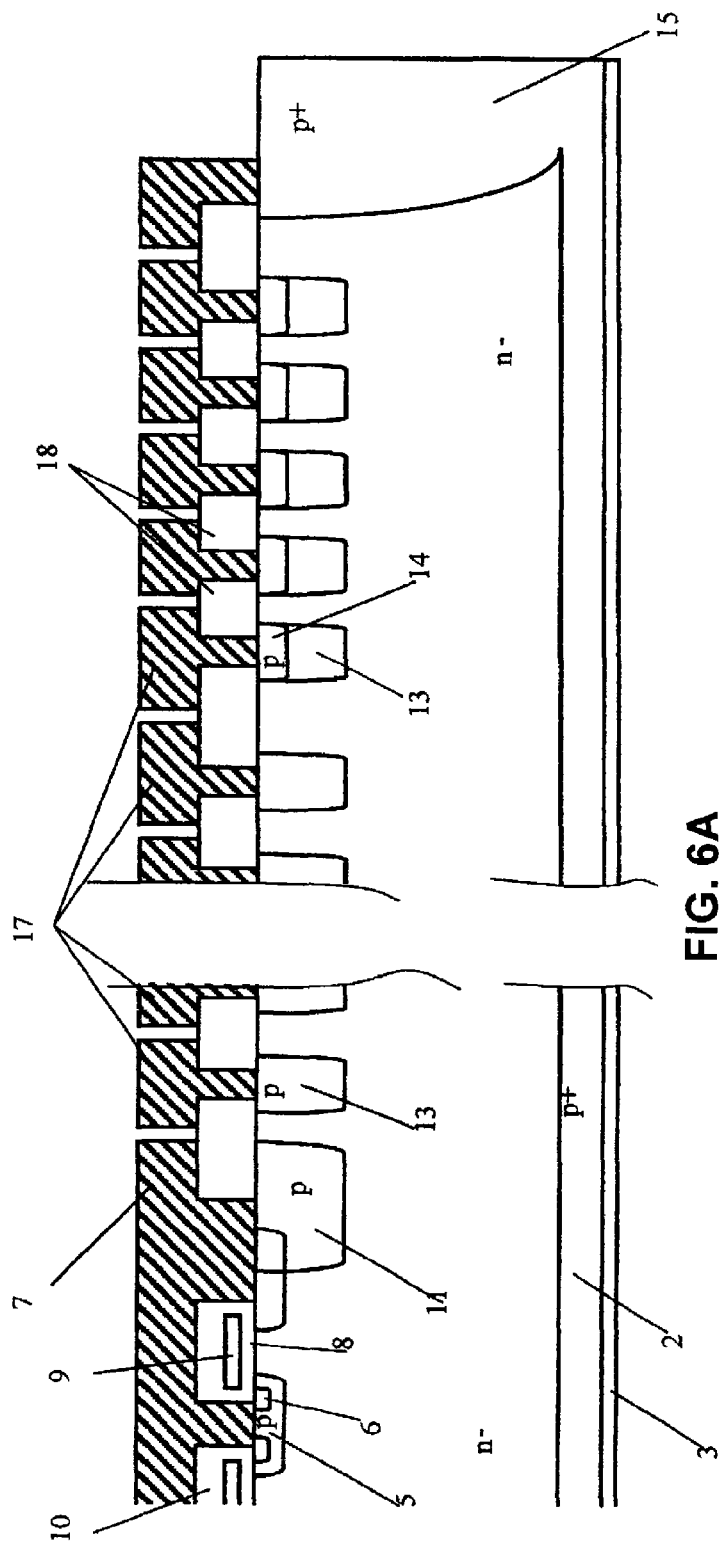
FIGS. 6(a) and 6(b) are a partial sectional view and a diagram of electric field distribution, respectively, of a voltage blocking structure region of a semiconductor substrate illustrated overlapping reverse blocking IGBTs of the invention and of the conventional one.
Figure 6B:
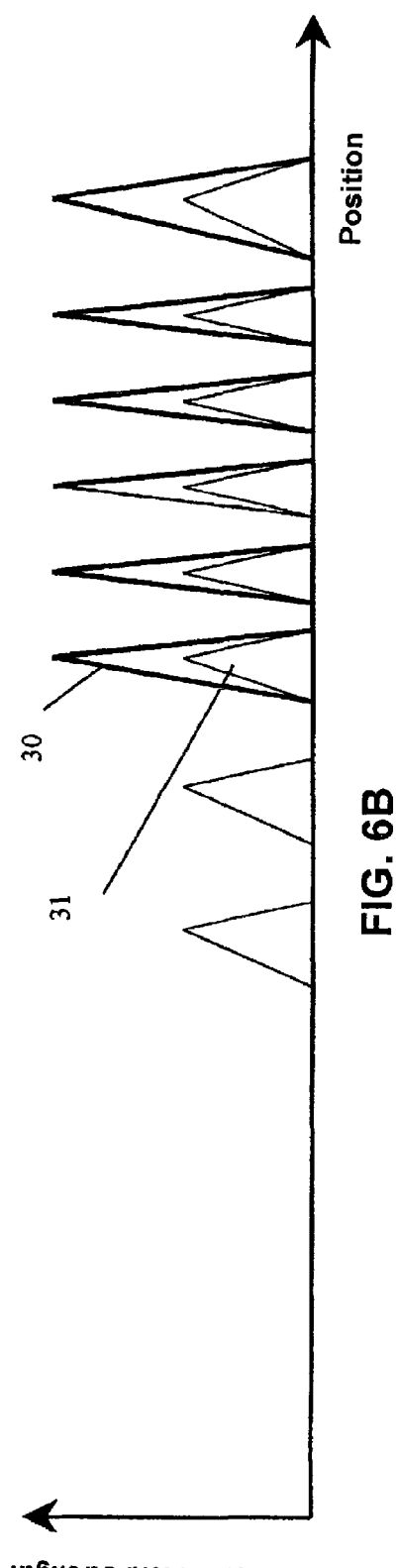

A study has been made about the electric field distribution on the surface of the voltage blocking structure regions by simulation to clarify electric potential shared by individual FLR in the voltage blocking structure regions 12 (FIG. 5) and 26 (FIG. 4) in a reverse blocking condition in the structure having FLRs formed by deep p-type layers similar to the p-type well 11 and in the structure having FLRs formed by shallow p-type layers similar to the p-type base region 5, the result of which is shown in FIGS. 6(a) and 6(b). FIG. 6(a) is a partial sectional view showing overlapping of the voltage blocking structure regions of the reverse blocking IGBTs of FIGS. 1-2 and FIG. 4. FIG. 6(b) shows distribution of electric field strength in the voltage blocking structure region in a reverse blocking condition obtained by the simulation, in which the ordinate represents the electric field strength and the abscissa represents the position in the voltage blocking structure region. In FIG. 6(b), the reference numeral 30 indicates the electric field strength in the structure with the second FLRs 14 and the reference numeral 31 indicates the one in the structure with the first FLRs. FIG. 6(b) clearly shows that the electric field strength is higher in the structure with the second FLRs 14 having the depth equal to that of the p-type base region 5. Since the electric potential shared by one FLR is higher in the structure with the second FLRs having a depth equal to the p-type base region 5, the width of the voltage blocking structure region can be shortened. Incidentally, the reference numerals in FIGS. 2 through 6 that are not mentioned in the above description indicate the same functional regions as the regions with the same reference numerals in FIG. 1-2.

Example 2

Figure 7:
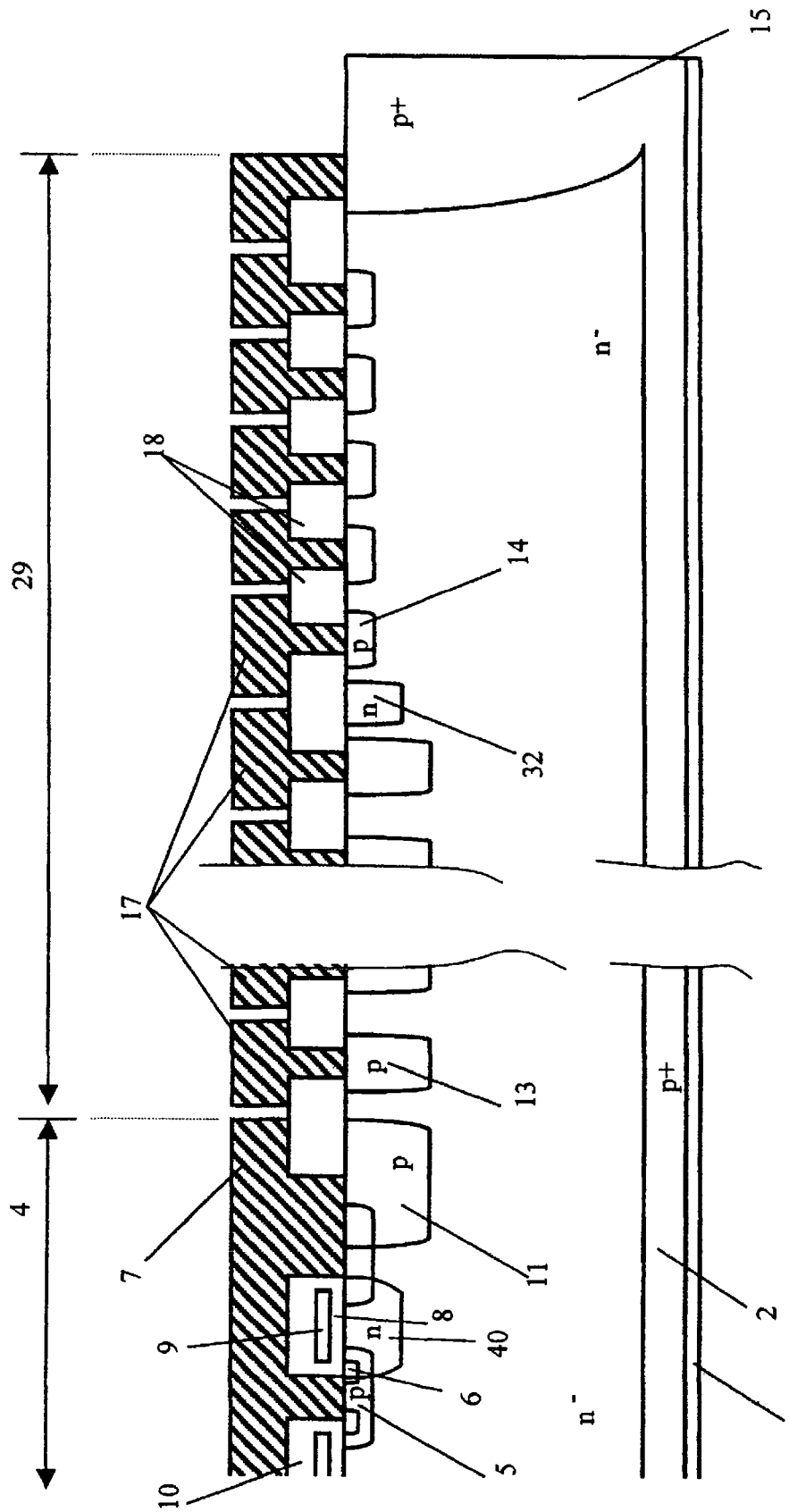
FIG. 7 is a partial sectional view of a voltage blocking structure region of a semiconductor substrate of a reverse blocking IGBT of Example 2 according to the invention.
Figures 8A, 8B:
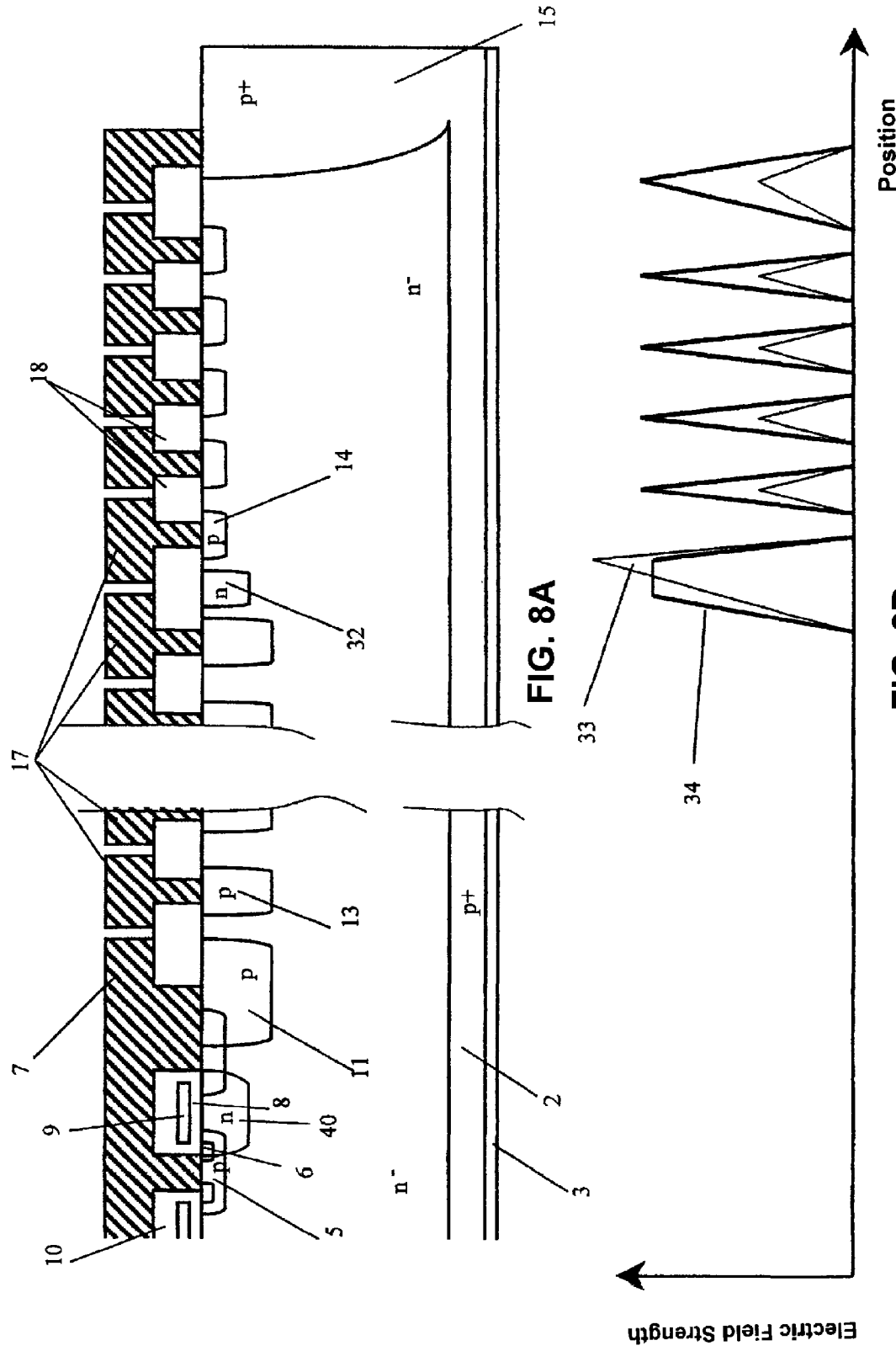
FIGS. 8(a) and 8(b) are a partial sectional view and a diagram of electric field distribution, respectively, of a voltage blocking structure region of a semiconductor substrate of a reverse blocking IGBT of Example 2 according to the invention.

Example 2 is an embodiment corresponding to claims 2, 5 and 14. FIG. 7 shows a voltage blocking structure region 29 having an n-type depletion controlling region 32 in the substrate surface region between the first FLRs and the second FLRs, wherein the first FLRs are p-type regions having a depth equal to that of the p-type well 11, the second FLRs are p-type regions having a depth equal to that of the p-type base region 5, and the n-type depletion controlling region 32 is formed simultaneously with the n-type counter doped region 40 and has the same diffusion depth as the n-type counter doped region 40. The voltage blocking structure region 29 is different from the voltage blocking region 12 in FIG. 1-2 only in that the former has the n-type depletion controlling region 32, although the counter doping region 40 is not depicted in FIG. 1-2. Electric field distribution on the surface of the voltage blocking structure region 29 of FIG. 7 is shown in FIG. 8(b). In the electric field distribution in the reversed blocking condition as shown in FIG. 8(b), the maximum electric field strength found at the n-type depletion controlling region 32 is lower in the structure of FIG. 8(a) as shown by a thick line than that in the structure without the n-type depletion controlling region 32 as shown in the thin line. Thus, the provision of the n-type depletion controlling region 32 lowers the maximum electric field strength, thereby alleviating electric field concentration at the place where the diffusion depth changes from the first FLRs to the second FLRs. Thus, the electric field distribution is made uniform and the shared electric potential is equalized. Since the integral of the electric field is a retainable voltage, that is, a breakdown voltage, the provision of the depletion controlling region 32 enhances the breakdown voltage. Conversely, the same breakdown voltage can be attained by a shorter length of a voltage blocking structure region. Incidentally, the reference numerals in FIGS. 7 and 8 that are not mentioned in the above description indicate the same functional regions as the regions with the same reference numerals as described earlier and descriptions are omitted.

Example 3

Example 3 is an embodiment corresponding to claim 4. FIG. 9(a) is the same partial sectional view as FIG. 1-2. FIG. 9(b) is an enlarged view of the encircled portion in FIG. 9(a) showing a portion of the voltage blocking structure region having the second FLRs 14 with the same depth as the p-type base region 5. In the FIGS. 9(a) and 9(b), at least one of the conductive filed plates 17 has such dimensions that a length W-FFP of the portion of the conductive field plate 17 protruding from the inside end of the second FLR 14 towards the emitter side (towards the left side in the figure) is shorter than a length W-BFP of the portion of the conductive filed plate 17 protruding from the outer end of the second FLR 14 towards the outer side (towards the right side in the figure). By setting the dimensions of the conductive filed plates 17 like this, the electric potential of the second FLRs 14 equals the electric potential of the conductive field plates 17, this short field plate make a length of an end portion having the same potential short, thereby suppressing extension of the depletion layer. In general, conductive filed plates are arranged so as to facilitate extension of a depletion layer for relaxation of the electric field. If such an arrangement is applied to a reverse blocking structure region involved in reverse blocking in a voltage blocking structure region of a reverse blocking semiconductor device, a depletion layer extends from the isolation diffusion layer and the whole collector layer at the back surface side and the voltage is hardly retained between the FLRs. Therefore, the length of the reverse blocking structure region needs to be long. However, by setting the dimensions of the conductive field plates 17 as described with reference to FIG. 9(a) and 9(b), the extension of the depletion layer is suppressed and the voltage is retained between the FLRs. By arranging this structure to the whole of the voltage blocking structure region, the reverse blocking voltage of each FLR and each field plate is raised, resulting in reduction of the voltage blocking region. Incidentally, the reference numerals in FIGS. 9(a) and 9(b) that are not mentioned in the above description indicate the same functional regions as the regions with the same reference numerals as described earlier and descriptions are omitted.

Example 4

Figure 10A:
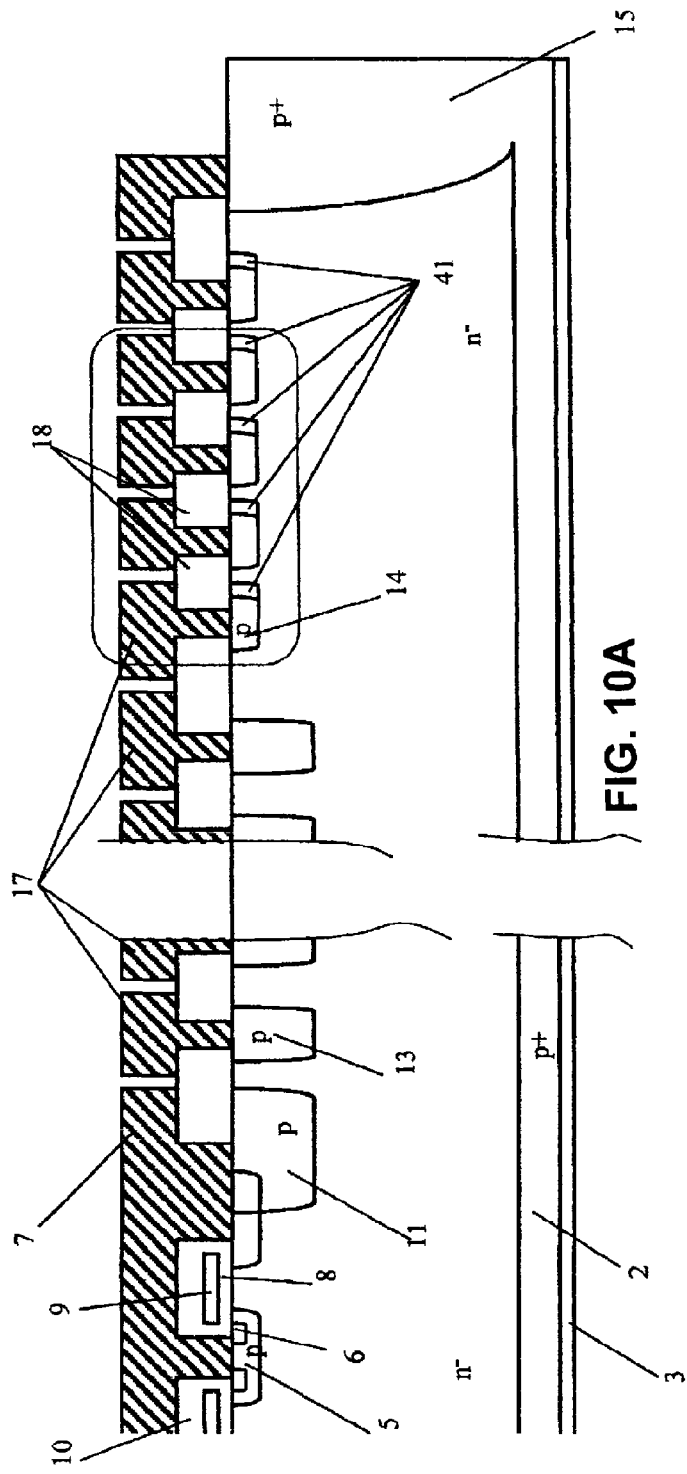
FIGS. 10(a) and 10(b) are partial sectional views of a voltage blocking structure region of a semiconductor substrate of a reverse blocking IGBT of Example 4 according to the invention.
Figure 10B:
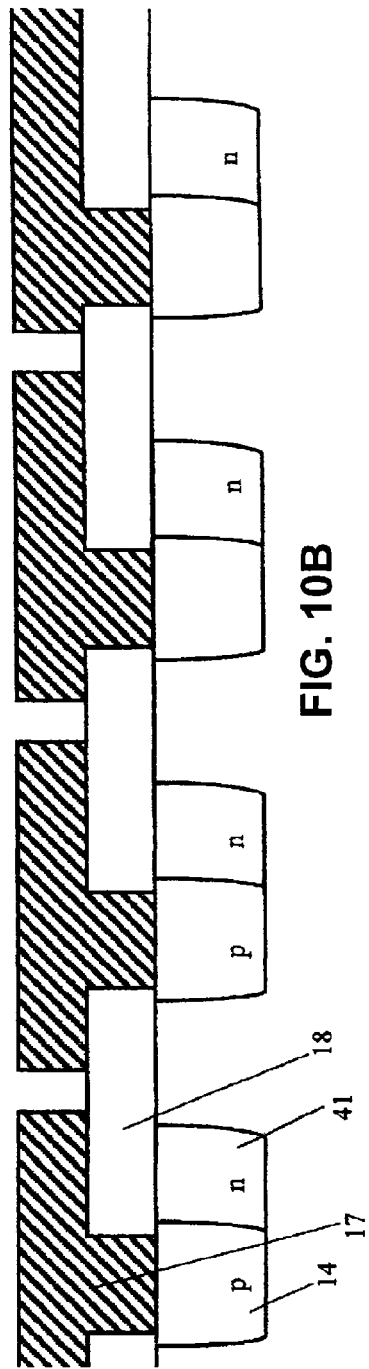
Figure 12:
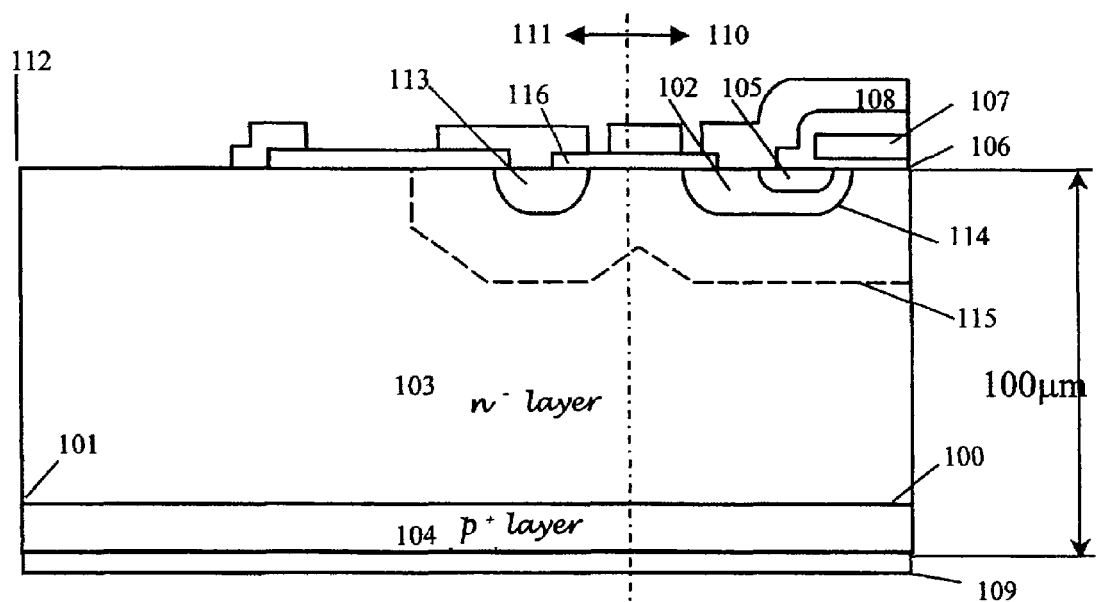
FIG. 12 is a partial sectional view of a chip peripheral region of a conventional IGBT of a planar type junction.
Figure 13:
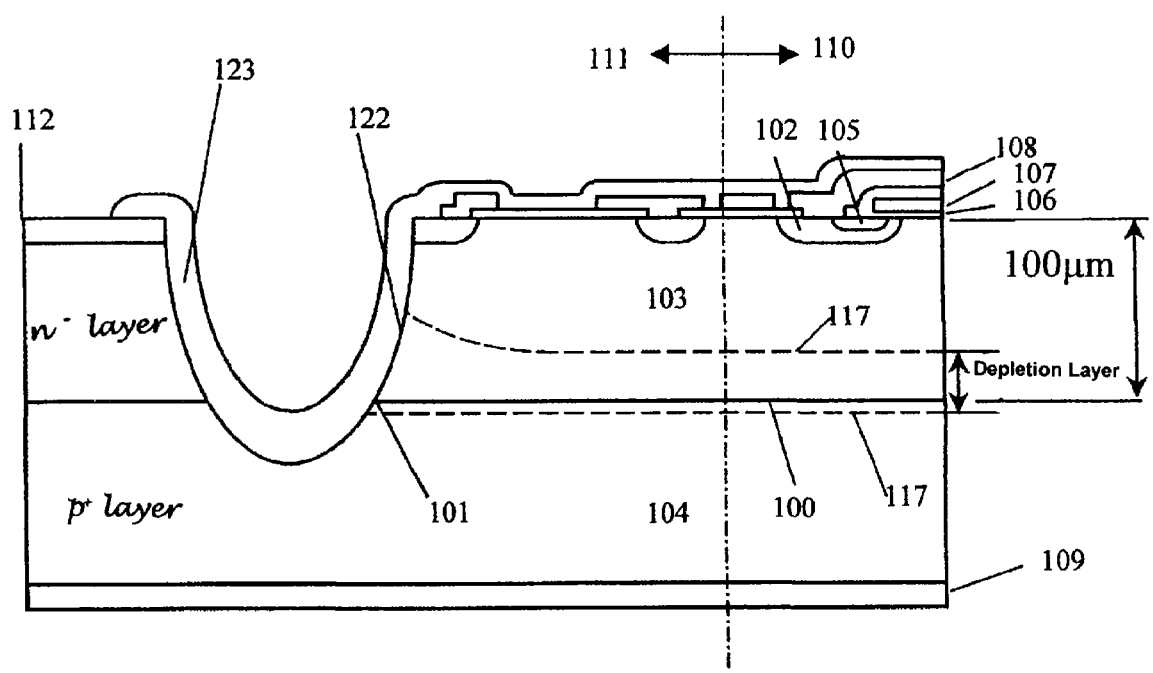
FIG. 13 is a partial sectional view of a chip peripheral region of a conventional IGBT of a mesa type junction.
Figure 14:
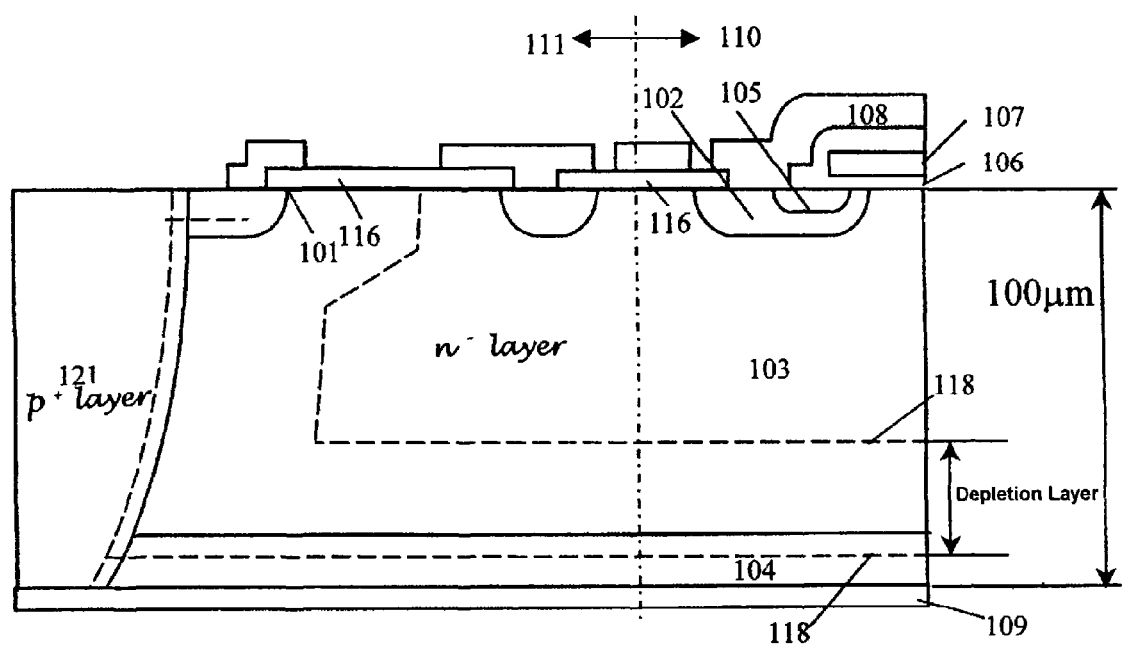
FIG. 14 is a partial sectional view of a chip peripheral region of a conventional IGBT of an isolation diffusion planar type junction.

Example 4 is an embodiment corresponding to claim 6. As shown in FIGS. 10(a) and 10(b), an n-type depletion controlling region 41 is selectively added to at least one of the p-type FLRs so that the n-type depletion controlling region 41 is in contact with the FLR in the isolation diffusion layer side. This structure suppresses extension of the depletion layer at the time of application of a reverse voltage by the n-type depletion controlling region 41, facilitating voltage retention between the FLRs. The length of the reverse blocking structure region is shortened, resulting in reduction of the length of the voltage blocking region. Incidentally, the reference numerals in FIGS. 10(a) and 10(b) that are not mentioned in the above description indicate the same functional regions as the regions with the same reference numerals as described earlier and descriptions are omitted.

Example 5

Example 5 is an embodiment corresponding to claim 7. By applying the structure of Example 3 or Example 4, the reverse blocking voltage of each FLR and each field plate is raised and a length (a depth on the substrate surface) of a voltage blocking structure region necessary for retaining a reverse blocking voltage is shortened. Thus, a length of the voltage blocking structure region for reverse blocking is made shorter than the length of the voltage blocking structure region for forward blocking. This is possible because a depletion layer extends from the whole of the collector layer in the back surface side and the isolation diffusion layer side. Therefore, a length of the voltage blocking structure region is shorter in the reverse blocking side than in the forward blocking side. Example 5 had a width of the voltage blocking structure region in the forward blocking side of 310 μm and a width of the voltage blocking structure region in the reverse blocking side of 260 μm, and ensured a breakdown voltage higher than 1,300 V in both forward and reverse directions.

Example 6

When two or more types of FLRs (as the first FLRs and the second FLRs) with different depths are formed so as to apply the feature of claim 11, the number of steps generally increases. However, two types of FLRs, FLRs 13 and FLRs 14 with different depths can be formed without increasing the number of steps by forming the FLRs 13 and FLRs 14 simultaneously with the steps of forming the p-type well 11 and the p-type base region 5, respectively, in the active region. Furthermore, the n-type depletion controlling region 32 (FIG. 8(a)) can be formed, corresponding to claim 14, simultaneously with the step of forming the n-type counter doped region 40 (FIG. 8(a)) formed between the p-type base regions 5 in the active region 4. In this Example 6, the n-type depletion controlling region 32 was selectively formed in the voltage blocking structure region 29 for retaining a reverse blocking voltage simultaneously with the step of counter doping step of phosphorus. Thus, the desired voltage blocking structure region 29 can be formed without increasing the number of steps by forming the p-type FLRs 14 and the p-type FLRs 13, and the n-type depletion controlling region 32 simultaneously with the steps for forming the p-type base region 5 and the p-well in the active region 4, and the step for forming the counter doped region 40, respectively. Therefore, the voltage blocking structure regions can be formed inexpensively without increasing the number of steps or raising the costs that would be accompanied by the increased steps.

Example 7

Example 7 is an embodiment corresponding to claim 8. Example 7 relates to a material of the conductive filed plates in contact with the surfaces of the FLRs. Since the conductive field plates are formed of the same material as the material of the gate electrode, the conductive field plates in contact with the surfaces of the FLRs can be processed in the same precision as the gate electrode that needs fine processing enabling fine structure in the voltage blocking structure region. Consequently, a chip size can be reduced. This step is carried out simultaneously with the step of forming the gate electrode without increasing the number of steps. Material for the gate electrode can be conductive polycrystalline silicon, which is easily processed and has a low resistivity (the resistivity can be reduced by ion implantation or doping). Other gate electrode materials can also be used as far as they allow easy processing and impart required properties.

Example 8

Example 8 is an embodiment corresponding to claim 9. Example 8 exhibits the same effect as Example 7 except that the conductive field plates are formed of the material for the emitter electrode. Example 8, in addition to the effects of Example 7, can reduce the electric field strength on the substrate surface by laminating an insulation film generally called as an interlayer insulation film to increase a thickness of the oxide film. This step of forming the conductive field plates is carried out simultaneously with the step of forming the emitter electrode without increasing a step of the fabrication process. Material for the emitter electrode can be a silicon-containing aluminum alloy. Other emitter electrode materials can also be used as far as they allow easy processing and impart required properties.

Example 9

Example 9 is an embodiment corresponding to claim 10. FIG. 11 is a partial sectional view of a voltage blocking structure region according to an embodiment of Example 9. In the structure of FIG. 11, conductive field plates 17-1 of conductive polycrystalline silicon with low resistivity used for the gate electrode 9 are made in contact with the surfaces of the first FLRs 13 and the second FLRs 14. Insulation films 18-1 are formed on the parts of the substrate surface between the first FLRs and between the second FLRs. Each of the conductive field plates 17-1 is protruding and covering the insulation film 18-1. The conductive field plates 17-1 are insulated from each other by interlayer insulation films 18-2. Field plates 17-2 made of Al—Si layer that is the same material as for the emitter electrode are laminated on the conductive field plates 17-1. This laminated electrode structure decreases variation of breakdown voltage caused by external electric charges imparted to the insulation film 18-1, improving reliability of the device. Incidentally, the reference numerals in FIGS. 11 that are not mentioned in the above description indicate the same functional regions as the regions with the same reference numerals as described earlier and descriptions are omitted. Other effects of this Example 4 are similar to those in Examples 7 and 8 and descriptions are omitted.

According to the Examples as described as far, plural types of FLRs (guard rings) of p-type having different depths can be formed in the same step as the step for forming the p-type well or the step for forming the p-type base region selectively formed in the surface region of the first principal surface of the n-type semiconductor substrate. Consequently, a device can be formed without increasing any step in fabrication process. Therefore, rise of manufacturing costs and a device cost are avoided. In general, a diffusion depth of a p-type base region is shallower than that of a p-type well, and an accompanying range of lateral diffusion is shorter. Consequently, the voltage blocking structure region formed simultaneously with a p-type base region having the FLRs (guard rings) can be made with smaller width. As a result a short voltage blocking structure region is obtained. Owing to the formation of the FLRs (guard rings) of the voltage blocking structure region simultaneously with the p-type base region, the device size is reduced. As a result costs of manufacturing the device is reduced. Owing to an n-type depletion control region formed on the surface between the first FLRs of a p-type region having a depth equal to that of the p-well and the second FLRs of a p-type region having a depth equal to that of the p-type base region, the electric field strength at the edge of the depletion control region, is suppressed, thereby reducing the distance between the electrodes each connected to the first FLR and the second FLR. Consequently, the voltage blocking structure region of the device can be shortened, to reduce a chip size. Since the electrodes on the p-type FLRs (guard rings) can be formed in the step of forming the gate electrode formed in the active region or in the step of forming the emitter electrode formed in the active region, a device can be formed without increasing any step in the fabrication process of the device. Therefore, rise in the cost for fabricating the device is restricted and a cost of the device does not increase. By forming the electrodes on the p-type FLRs (guard rings) with the material for the gate electrode formed in the active region, the electrodes on the FLRs (guard rings) in the voltage blocking structure region can be processed in the same dimensional precision as the gate electrode that needs micromachining, so that the voltage blocking structure region can be made in a fine structure. Therefore, the chip size can be reduced.

This application is based on, and claims priority to, Japanese Patent Application No. 2008-023435, filed on Feb. 4, 2008. The disclosure of the priority application in its entirety, including the drawings, claims, and the specification thereof, is incorporated herein by reference.

What is claimed is:

1. A semiconductor device comprising:
   a semiconductor substrate of a first conductivity type;
   an active region that includes a well of a second conductivity type selectively formed in a surface region of a first principal surface side of the semiconductor substrate;
   a base region of the second conductivity type selectively formed in the surface region at a different position from that of the well;
   an emitter region of the first conductivity type selectively formed in a surface region of the base region of the second conductivity type;
   a gate insulation film covering a portion of a surface of the base region of the second conductivity type locating between a surface of the emitter region and a portion of the surface of the semiconductor substrate;
   a gate electrode formed on the gate insulation film;
   an isolation diffusion region of the second conductivity type formed surrounding the active region and extending from the first principal surface to a second principal surface of the semiconductor substrate;
   a collector region of the second conductivity type formed in a surface region of the second principal surface;

a voltage blocking structure region formed between the isolation diffusion region of the second conductivity type and the active region; and an emitter electrode in contact commonly with both a surface of the emitter region and a portion of the surface of the base region;

wherein the voltage blocking structure region includes a plurality of deep first field limiting rings in an inner circumferential side of the surface region of the first principal surface side, a plurality of shallow second field limiting rings in an outer circumferential side of the surface region of the first principal surface side, a plurality of insulation films each covering a portion of the first principal surface between the first field limiting rings and a portion of the principal surface between the second field limiting rings, and a plurality of conductive field plates in contact with the field limiting ring, the field limiting ring projecting over surfaces of the adjacent insulation films.

2. The semiconductor device according to claim 1 further comprising a counter doped region of the first conductivity type with a depth not shallower than a depth of the base region of the second conductivity type and not deeper than a depth of the well of the second conductivity type formed in a portion of the surface region of the semiconductor substrate between the adjacent base regions of the second conductivity type and extending to portions of the adjacent base regions locating between the emitter region and the portion of the surface region of the semiconductor substrate, the counter doped region having such an impurity concentration that does not invert the conductivity type of the base region of the second conductivity type.

3. The semiconductor device according to claim 2, wherein a depth of the first field limiting rings is substantially equal to a depth of the well of the second conductivity type and a depth of the second field limiting rings is substantially equal to a depth of the base region of the second conductivity type.

4. The semiconductor device according to claim 3, wherein at least one of the conductive field plates has a length of a portion thereof protruding over the surface of the insulation film in the emitter side shorter than a length of a portion thereof protruding over the surface of the insulation film in the isolation diffusion region side.

5. The semiconductor device according to claim 4, further comprising a depletion controlling layer of the first conductivity type formed in a surface region between the first field limiting rings and the second field limiting rings.

6. The semiconductor device according to claim 4, further comprising at least one depletion control layer of the first conductivity type selectively formed in contact with the field limiting ring solely in the isolation diffusion layer side.

7. The semiconductor device according to claim 1, wherein a width of a portion of the voltage blocking structure region for forward direction blocking is longer than a width of a portion of the voltage blocking structure region for reverse direction blocking.

8. The semiconductor device according to claim 1, wherein the conductive field plates in contact with the field limiting rings are composed of the same material as a material of the gate electrode.

9. The semiconductor device according to claim 1, wherein the conductive field plates in contact with the field limiting rings are composed of the same material as a material of the emitter electrode in contact commonly with both the surface of the emitter region and the surface of the base region.

10. The semiconductor device according to claim 1, wherein the conductive field plate in contact with the surface of the field limiting ring is composed of a lamination comprising a portion made of a material same as that of the gate electrode and a portion made of a material same as that of the emitter electrode.

11. A method of manufacturing a semiconductor device comprising the steps of:

providing a semiconductor substrate of a first conductivity type;

forming an active region that includes a well of a second conductivity type selectively in a surface region of a first principal surface side of the semiconductor substrate;

forming a base region of the second conductivity type in the surface region at a different position from that of the well;

forming an emitter region of the first conductivity type in a surface region of the base region of the second conductivity type;

forming a gate insulation film covering a portion of a surface of the base region of the second conductivity type locating between a surface of the emitter region and a portion of the surface of the semiconductor substrate;

forming a gate electrode on the gate insulation film;

forming an isolation diffusion region of the second conductivity type surrounding the active region and extending from the first principal surface to a second principal surface of the semiconductor substrate;

forming a collector region of the second conductivity type in a surface region of the second principal surface;

forming a voltage blocking structure region between the isolation diffusion region of the second conductivity type and the active region; and forming an emitter electrode in contact commonly with both a surface of the emitter region and a portion of the surface of the base region;

wherein the voltage blocking structure region includes a plurality of deep first field limiting rings in an inner circumferential side of the surface region of the first principal surface side, a plurality of shallow second field limiting rings in an outer circumferential side of the surface region of the first principal surface side, a plurality of insulation films each covering a portion of the first principal surface between the first field limiting rings and a portion of the principal surface between the second field limiting rings, and a plurality of conductive field plates in contact with the field limiting ring, the field limiting ring projecting over surfaces of the adjacent insulation films.

12. The method of manufacturing the semiconductor device defined by claim 11, wherein:

the first field limiting rings and the well of the second conductivity type are simultaneously formed, and the second field limiting rings and the base region of the second conductivity type are simultaneously formed.

13. The method of manufacturing the semiconductor device according to claim 11, wherein the conductive field plates and the gate electrode are simultaneously formed.

14. The method of manufacturing the semiconductor device according to claim 12, wherein the conductive field plates and the emitter electrode are simultaneously formed.

15. The method of manufacturing the semiconductor device according to claim 11, wherein the depletion controlling layer of the first conductivity type and the counter doped region of the first conductivity type are simultaneously formed.

* * * * *